US007012125B2

(12) United States Patent
Kennedy et al.

(10) Patent No.: US 7,012,125 B2
(45) Date of Patent: *Mar. 14, 2006

(54) SPIN-ON-GLASS ANTI-REFLECTIVE COATINGS FOR PHOTOLITHOGRAPHY

(75) Inventors: Joseph Kennedy, San Jose, CA (US); Teresa Baldwin, Fremont, CA (US); Nigel P. Hacker, Palo Alto, CA (US); Richard Spear, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 194 days.

This patent is subject to a terminal disclaimer.

(21) Appl. No.: 10/012,649

(22) Filed: Nov. 5, 2001

(65) Prior Publication Data

US 2002/0055000 A1 May 9, 2002

Related U.S. Application Data

(62) Division of application No. 09/698,883, filed on Oct. 27, 2000, now Pat. No. 6,365,765, which is a division of application No. 09/330,248, filed on Jun. 10, 1999, now Pat. No. 6,268,457.

(51) Int. Cl.
*C08G 77/18* (2006.01)

(52) U.S. Cl. ............................ 528/26; 528/29; 528/28; 528/25; 528/31; 528/39; 528/43; 428/447; 106/287.11; 106/287.13; 106/287.14; 106/287.16; 523/137

(58) Field of Classification Search ................ 528/39, 528/31, 26, 28, 29, 25, 43; 428/447; 106/287.11, 106/287.13, 287.14, 287.16; 523/137
See application file for complete search history.

(56) References Cited

U.S. PATENT DOCUMENTS

| 3,784,378 A | 1/1974 | Gramas ........................ 96/27 |
| 3,925,077 A | 12/1975 | Lewis et al. ................. 96/35.1 |
| 3,929,489 A | 12/1975 | Arcesi et al. ................. 96/115 |
| 4,018,606 A | 4/1977 | Contois et al. ............... 96/1.7 |
| 4,018,607 A | 4/1977 | Contois ........................... 96/1 |
| 4,043,812 A | 8/1977 | Stolka et al. ................. 96/1.5 |
| 4,048,146 A | 9/1977 | Wilson ........................ 260/63 |
| 4,052,367 A | 10/1977 | Wilson ........................ 260/63 |
| 4,102,683 A | 7/1978 | DiPiazza .................... 96/38.4 |
| 4,308,371 A | 12/1981 | Tanaka et al. ................ 528/18 |
| 4,348,471 A | 9/1982 | Shelnut et al. .............. 430/165 |
| 4,362,809 A | 12/1982 | Chen et al. ................. 430/312 |
| 4,363,859 A | 12/1982 | Sasaki et al. ................. 430/59 |
| 4,413,052 A | 11/1983 | Green et al. ................ 430/327 |
| 4,442,197 A | 4/1984 | Crivello et al. ............. 430/280 |
| 4,456,679 A | 6/1984 | Leyrer et al. ............... 430/326 |
| 4,557,996 A | 12/1985 | Aoyama et al. ............ 430/324 |
| 4,594,309 A | 6/1986 | Guillet ....................... 430/270 |
| 4,609,614 A | 9/1986 | Pampalone et al. ......... 430/323 |
| 4,624,912 A | 11/1986 | Zweifel et al. ............. 430/258 |
| 4,678,835 A | 7/1987 | Chang et al. ................ 525/100 |
| 4,693,959 A | 9/1987 | Ashcraft ..................... 430/323 |
| 4,705,729 A | 11/1987 | Sheats ........................... 430/5 |
| 4,705,739 A | 11/1987 | Fisch ......................... 430/276 |
| 4,708,925 A | 11/1987 | Newman .................... 430/270 |
| 4,731,264 A | 3/1988 | Lin et al. .................... 427/387 |
| 4,732,858 A | 3/1988 | Brewer et al. ............. 438/228 |
| 4,783,347 A | 11/1988 | Doin et al. ................. 427/379 |
| 4,816,049 A | 3/1989 | Hata et al. ................... 65/3.2 |
| 4,822,718 A | 4/1989 | Latham et al. ............. 430/271 |
| 4,863,827 A | 9/1989 | Jain et al. ................... 430/145 |
| 4,876,165 A | 10/1989 | Brewer et al. ................ 430/7 |
| 4,942,083 A | 7/1990 | Smith, Jr. ................... 428/252 |
| 4,970,134 A | 11/1990 | Bronstert et al. ........... 430/271 |
| 4,973,510 A | 11/1990 | Tanaka ....................... 428/212 |
| 5,049,414 A | 9/1991 | Kato .......................... 427/164 |
| 5,104,692 A | 4/1992 | Belmares ................... 427/164 |
| 5,173,368 A | 12/1992 | Belmares ................... 428/426 |
| 5,199,979 A | 4/1993 | Lin et al. ............... 106/287.14 |
| 5,359,022 A | 10/1994 | Mautner et al. ............. 528/23 |

(Continued)

FOREIGN PATENT DOCUMENTS

JP           06-56560      *   6/1994

OTHER PUBLICATIONS

English language translation 06–56560.*
JP No. 2001–92122 (P2001–92122A) Apr. 6, 2001.
406056560A.
Honeywell, "Material Safety Data Sheet, Accuglass T–08 (108, 208) Spin–On Glass", Jun. 19, 2002, pp. 1–8.
Honeywell, "Material Safety Data Sheet, Accuglass T–04 Spin–On Glass", Jun. 30, 1998, pp. 1–7.
Honeywell, "Material Safety Data Sheet, Accuspin 720 Spin–On Polymer", Mar. 7, 2000, pp. 1–7.
Lin et al. "Linewidth Control Using Anti–Reflective Coating for Optical–Lithography", pp. 399–402.
Tanaka et al. "A New Photolighography Technique with Antireflective Coating on Resist: ARCOR", pp. 3900–3904.
Berg et al. "Antireflection coatings on metal layers for photolithographic purposes", p. 1212.
Brewer et al. "The Reduction of the Standing–wave Effect in Positive Photoresists", pp. 184–186.
Resiser "Photoreactive Polymers –Multilayer Techniques and Plasma Processing", pp. 359–367.
Sheates "Photobleaching Chemistry of Polymers. Containing ", pp. 332–348.

*Primary Examiner*—Margaret G. Moore
(74) *Attorney, Agent, or Firm*—Bingham McCutchen; Sandra P. Thompson

(57) ABSTRACT

Anti-reflective coating materials for deep ultraviolet photolithography include one or more organic dyes incorporated into spin-on-glass materials. Suitable dyes are strongly absorbing over wavelength ranges around wavelengths such as 248 nm and 193 nm that may be used in photolithography. A method of making dyed spin-on-glass materials includes combining one or more organic dyes with alkoxysilane reactants during synthesis of the spin-on-glass materials.

22 Claims, 3 Drawing Sheets

U.S. PATENT DOCUMENTS

| | | | |
|---|---|---|---|
| 5,432,007 A | 7/1995 | Naito | 428/447 |
| 5,439,872 A | 8/1995 | Ito et al. | 503/227 |
| 5,449,712 A | 9/1995 | Gierke et al. | 524/266 |
| 5,518,818 A | 5/1996 | Kidai et al. | 428/412 |
| 5,580,819 A | 12/1996 | Li et al. | 427/167 |
| 5,583,195 A | 12/1996 | Eckberg | 528/26 |
| 5,597,408 A | 1/1997 | Choi | 106/481 |
| 5,661,196 A | 8/1997 | Mayer et al. | 523/122 |
| 5,695,551 A | 12/1997 | Buckingham et al. | 106/2 |
| 5,719,249 A | 2/1998 | Fujita et al. | 528/27 |
| 5,744,243 A | 4/1998 | Li et al. | 428/447 |
| 5,755,867 A | 5/1998 | Chikuni et al. | 106/287.16 |
| 5,800,926 A | 9/1998 | Nogami et al. | 428/447 |
| 5,855,960 A | 1/1999 | Ohnishi et al. | 427/337 |
| 5,873,931 A | 2/1999 | Scholz et al. | 106/13 |
| 5,929,159 A | 7/1999 | Schutt et al. | 524/544 |
| 5,945,172 A | 8/1999 | Yamaya et al. | 427/503 |
| 5,997,621 A | 12/1999 | Scholz et al. | 106/13 |
| 6,025,077 A | 2/2000 | Yamaki et al. | 428/447 |
| 6,051,310 A | 4/2000 | Cano et al. | 428/336 |
| 6,096,460 A * | 8/2000 | French et al. | 430/5 |
| 6,174,631 B1 | 1/2001 | French et al. | 430/5 |
| 6,174,977 B1 | 1/2001 | Ariyoshi et al. | 526/194 |
| 6,180,025 B1 | 1/2001 | Schoenfeld et al. | 252/299.01 |
| 6,194,534 B1 | 2/2001 | Baumann et al. | 528/25 |
| 6,232,424 B1 | 5/2001 | Zhong et al. | 528/12 |
| 6,268,108 B1 | 7/2001 | Iguchi et al. | 430/271.1 |
| 6,268,457 B1 * | 7/2001 | Kennedy et al. | 528/39 |
| 6,323,268 B1 | 11/2001 | Fisher et al. | 524/266 |
| 6,365,765 B1 * | 4/2002 | Baldwin et al. | 556/440 |
| 6,368,400 B1 * | 4/2002 | Baldwin et al. | 106/481 |
| 6,387,519 B1 | 5/2002 | Anderson et al. | 428/447 |
| 6,420,088 B1 * | 7/2002 | Angelopoulos et al. | 430/272.1 |
| 6,432,191 B1 | 8/2002 | Schutt | 106/287.13 |
| 6,472,012 B1 | 10/2002 | Nakada et al. | 427/58 |
| 6,488,394 B1 | 12/2002 | Mabe et al. | 362/510 |
| 6,515,073 B1 | 2/2003 | Sakamoto et al. | 525/100 |
| 6,592,999 B1 | 7/2003 | Anderson et al. | 428/447 |
| 6,605,359 B1 | 8/2003 | Robinson et al. | 428/447 |
| 6,605,360 B1 | 8/2003 | Kizaki et al. | 428/447 |
| 6,623,791 B1 | 9/2003 | Sadvary et al. | 427/140 |
| 6,635,341 B1 | 10/2003 | Barancyk et al. | 428/323 |
| 6,676,740 B1 | 1/2004 | Matsumura et al. | 106/287.1 |
| 6,730,454 B1 | 5/2004 | Pfeiffer et al. | 430/270.1 |
| 6,756,124 B1 | 6/2004 | Kanamori et al. | 428/447 |
| 6,777,092 B1 | 8/2004 | Hayashi et al. | 428/429 |
| 2002/0031729 A1 | 3/2002 | Trefonsas, III et al. | 430/322 |
| 2002/0034630 A1 | 3/2002 | Cano et al. | 428/331 |
| 2002/0102417 A1 | 8/2002 | Schutt et al. | 428/447 |
| 2002/0127330 A1 | 9/2002 | Jin et al. | 427/162 |
| 2003/0157391 A1 | 8/2003 | Coleman et al. | 429/34 |

* cited by examiner anthraflavic acid
1

9-anthracene carboxylic acid
2

9-anthracene methanol
3 alizarin
4 quinizarin
5 primuline
6

2-hydroxy-4(3-triethoxysilylpropoxy)-
diphenylketone
7 rosolic acid
8 triethoxysilylpropyl-1,8-naphthalimide
9

9-anthracene carboxy-methyl triethoxysilane
10

SPIN-ON-GLASS ANTI-REFLECTIVE COATINGS FOR PHOTOLITHOGRAPHY

This application is a division of allowed application Ser. No. 09/698,883, filed Oct. 27, 2000, now U.S. Pat No. 6,365,765 which was a divisional of issued application Ser. No. 09/330,248 filed on Jun. 10, 1999 now U.S. Pat. No. 6,268,457.

TECHNICAL FIELD

The present invention relates generally to spin-on glass materials and more specifically to spin-on glass materials containing dyes for use as anti-reflective layers in photolithography and methods of producing the materials.

BACKGROUND

To meet the requirements for faster performance, the characteristic dimensions of features of integrated circuit devices have continued to be decreased. Manufacturing of devices with smaller feature sizes introduces new challenges in many of the processes conventionally used in semiconductor fabrication. One of the most important of these fabrication processes is photolithography.

It has long been recognized that linewidth variations in patterns produced by photolithography can result from optical interference from light reflecting off an underlying layer on a semiconductor wafer. Variations in photoresist thickness due to the topography of the underlying layer also induce linewidth variations. Anti-reflective coatings (ARC) applied under a photoresist layer have been used to prevent interference from reflection of the irradiating beam. In addition, anti-reflective coatings partially planarize the wafer topography, helping to improve linewidth variation over steps because the photoresist thickness is more uniform.

Organic polymer films, particularly those that absorb at the i-line (365 nm) and g-line (436 nm) wavelengths conventionally used to expose photoresists, and at the recently used 248 nm wavelength, have been employed as anti-reflective coatings. However, the fact that the organic ARC's share many chemical properties with the organic photoresists can limit usable process sequences. Furthermore organic ARC's may intermix with photoresist layers. One solution to avoid intermixing, is to introduce thermosetting binders as additional components of organic ARC's, as described, for example in U.S. Pat. No. 5,693,691 to Flaim et al. Dyes may also be incorporated in organic ARC's, as well as, optionally, additional additives such as wetting agents, adhesions promoters, preservatives and plasticisizers, as described in U.S. Pat. No. 4,910,122 to Arnold et al.

Silicon oxynitride is another material that has been used as an anti-reflective coating., However, silicon oxynitride works as an ARC by a destructive interference process rather than by absorption, which means that very tight control of the oxynitride thickness is necessary and that the material may not work well as an ARC over highly variable topography. Furthermore silicon oxynitride is typically deposited by chemical vapor deposition, while photoresist layers are typically applied using a spin-coater. The additional chemical vapor deposition process can add to processing complexity.

Yet another class of materials that can be used as an anti-reflective layer is spin-on-glass (SOG) compositions containing a dye. Yau et al., U.S. Pat. No. 4,587,138, disclose a dye such as basic yellow #11 mixed with a spin-on-glass in an amount approximately 1% by weight. Allman et al. U.S. Pat. No. 5,100,503 disclose a cross-linked polyorganosiloxane containing an inorganic dye such as $TiO_2$, $Cr_2O_7$, $MoO_4$, $MnO_4$, or $ScO_4$, and an adhesion promoter. Allman additionally teaches that the spin-on-glass compositions also serve as a planarizing layer. However, the spin-on-glass, dye combinations that have been disclosed to date are not optimal for exposure to the deep ultraviolet, particularly 248 and 193 nm, light sources that are coming into use to produce devices with small feature sizes. Furthermore, not all dyes can be readily incorporated into an arbitrary spin-on-glass composition.

What is needed is a dyed spin-on-glass anti-reflective coating material that absorbs strongly and uniformly in the deep ultraviolet spectral region. It would be desirable for the ARC layer to be impervious to photoresist developers. It would also be desirable to provide a method to incorporate a range of dyes into a variety of SOG materials while retaining the desirable properties of the original spin-on-glass materials.

SUMMARY

An anti-reflective coating material for deep ultraviolet photolithography includes one or more organic dyes incorporated into a spin-on-glass (SOG) material. The spin-on-glass materials include methylsiloxane, methylsilsesquioxane, methylphenylsiloxane, methylphenylsilsesquioxane, and silicate polymers. Dyes suitable for use with the present invention are strongly absorbing over at least an approximately 10 nm wide wavelength range around wavelengths such as 248 nm, 193 nm, or other ultraviolet wavelengths that may be used in photolithography. The chromophores of suitable dyes typically have from one to three benzene rings that may or may not be fused. Incorporatable dyes have an accessible reactive group attached to the chromophore, the reactive groups including hydroxyl groups, amine groups, carboxylic acid groups, and groups with bridges to silicontriethoxy groups.

Suitable organic dyes include anthraflavic acid, 9-anthracene carboxylic acid, 9-anthracene methanol, alizarin, quinizarin, primuline, 2-hydroxy-4(3-triethoxysilylpropoxy)-diphenylketone, rosolic acid, triethoxysilylpropyl-1,8-naphthalimide, 9-anthracene carboxy-methyl triethoxysilane, and mixtures thereof.

According to another aspect of the present invention, methods for synthesizing dyed spin-on-glass compositions are provided. Spin-on-glass materials are conventionally synthesized from alkoxysilane reactants such as tetraethoxysilane, methyltriethoxysilane, dimethyldiethoxysilane, tetramethoxysilane, methyltrimethoxysilane, phenyltriethoxysilane, and phenyltrimethoxysilane. A method of making a dyed spin-on-glass composition includes combining one or more alkoxysilanes, one or more incorporatable organic dyes, an acid/water mixture, such as a nitric acid/water mixture, and one or more solvents to form a reaction mixture; and refluxing the reaction mixture to form the dyed spin-on-glass composition. The spin-on-glass composition so formed is diluted with one or more solvents to provide coating solutions that produce films of various thicknesses.

According to yet another aspect of the invention, the organic dye of the chemical composition 9-anthracene carboxy-methyl triethoxysilane is provided. A method of synthesizing 9-anthracene carboxy-methyl triethoxysilane includes combining 9-anthracene carboxylic acid, chloromethyltriethoxysilane, triethylamine, and a solvent to form a reaction mixture; refluxing the reaction mixture; cooling the refluxed reaction mixture to form a precipitate and a remaining solution; and filtering the remaining solution to produce liquid 9-anthracene carboxy-methyl triethoxysilane.

DETAILED DESCRIPTION

An anti-reflective coating material for deep ultraviolet photolithography includes one or more organic dyes incorporated into a spin-on-glass (SOG) material. The dyed spin-on-glass compositions are dissolved in appropriate solvents to form coating solutions and applied to various layers of materials in fabricating semiconductor devices. The dyed spin-on-glass anti-reflective coatings have been designed to be readily integrated into existing semiconductor fabrication processes. Properties that provide integration include developer resistance, thermal stability during standard photoresist processing, and selective removal with respect to underlying layers.

The spin-on-glass materials used in compositions according to aspects of the present invention, include methylsiloxane methylsilsesquioxane. methylphenylsiloxane, methylphenylsilsesquioxane, and silicate polymers. Many naphthalene- and anthracene-based dyes have significant absorption at 248 nm and below. However, not all such dyes can be incorporated into siloxane spin-on-glasses for use as ARC materials. Dyes suitable for use with the present invention are strongly absorbing, that is they have an absorption coefficient greater than 0.5 $cm^{-1}$, over at least an approximately 10 mn wide wavelength range around wavelengths such as 248 nm, 193 nm, or other ultraviolet wavelengths that may be used in photolithography. Dyes which only have narrow absorption peaks, for example, less than 2 nm wide, around these wavelengths are not as desirable. The chromophores of suitable dyes typically have from one to three benzene rings that may or may not be fused. Incorporatable dyes have an accessible reactive group attached to the chromophore, the reactive groups including hydroxyl groups, amine groups, carboxylic acid groups, and groups with bridges to silicontriethoxy groups. The inclusion of silicontriethoxy groups on chromophores has been found to be advantageous.

Figure 1A:
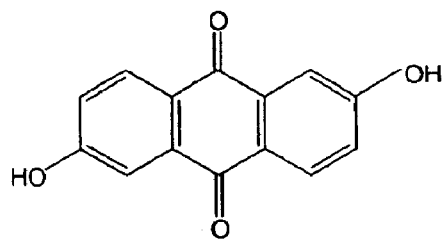
FIGS. 1a and 1b illustrate the chemical formulas of dyes incorporated into spin-on-glass compositions, according to embodiments of the present invention.
Figure 1A:
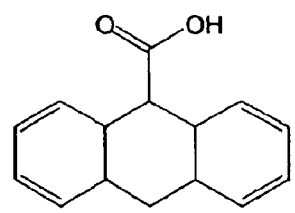
Figure 1A:
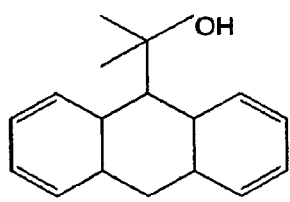
Figure 1A:
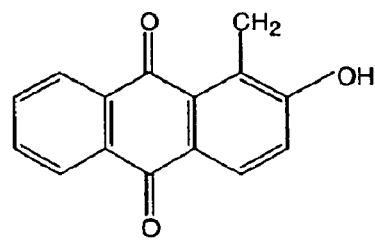
Figure 1A:
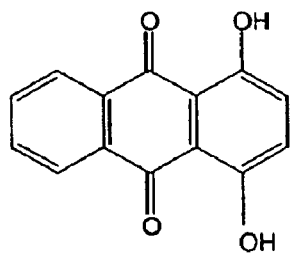
Figure 1A:
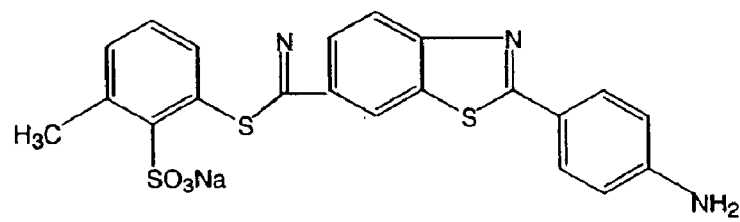
Figure 1B:
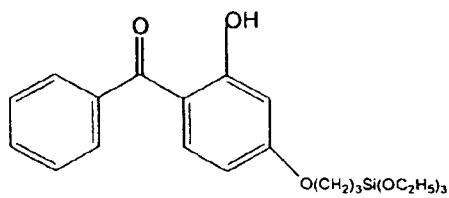
Figure 1B:
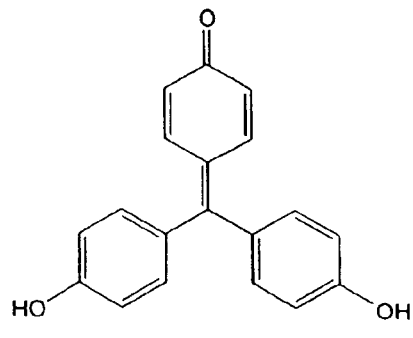
Figure 1B:
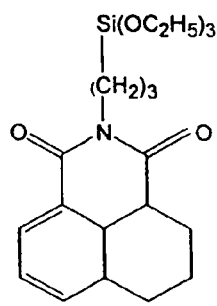
Figure 1B:
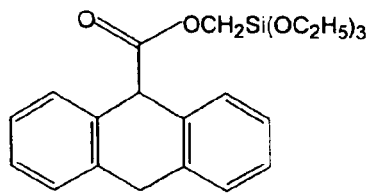

Examples of dyes suitable for use with the present invention include anthraflavic acid (1), 9-anthracene carboxylic acid (2), 9-anthracene methanol (3), alizarin (4), quinizarin (5), primuline (6), 2-hydroxy-4(3-triethoxysilylpropoxy)-diphenylketone (7), rosolic acid (8), triethoxysilylpropyl-1, 8-naphthalimide (9), and 9-anthracene carboxy-methyl triethoxysilane (10), and combinations, thereof. Chemical formulas of dyes 1–10 are illustrated in FIGS. 1a and 1b. Advantageous results have been obtained, for example, with 9-anthracene carboxy-methyl triethoxysilane (10) and with combinations of 9-anthracene methanol (3), 2-hydroxy-4(3-triethoxysilylpropoxy)-diphenylketone (7), and rosolic acid (8). Dyes 1–9 are available commercially, for example, from Aldrich Chemical Company (Milwaukee, Wis.). Dye 10 is synthesized using esterification methods, as described immediately below.

A method of synthesizing 9-anthracene carboxy-methyl triethoxysilane (10) uses 9-anthracene carboxylic acid (2) and chloromethyl triethoxysilane as reactants. The reactants are combined with triethylamine and methylisobutylketone (MIBK), previously dried over 4 Å molecular sieves, to form a reaction mixture which is heated to reflux and refluxed for from approximately 6 to 10 hours. After reflux, the reaction mixture is cooled overnight leading to a large quantity of solid precipitate. The remaining solution is roto-evaporated, filtered through a silica gel column, and roto-evaporated a second time, to produce 9-anthracene carboxy-methyl triethoxysilane (10) as a dark amber oily liquid.

According to another aspect of the present invention, methods for synthesizing dyed spin-on-glass compositions are provided. Spin-on-glass materials are typically synthesized from silane reactants including tetraethoxysilane (TEOS), methyltriethoxysilane (MTEOS), dimethyldiethoxysilane, tetramethoxysilane (TMOS), methyltrimethoxysilane (MTMOS), phenyltriethoxysilane (PTEOS), and phenyltrimethoxysilane (PTMOS). To produce the dyed spin-on-glass compositions, the dyes, such as dyes 1–10, or combinations thereof, are combined with the silane reactants during the synthesis of the SOG materials.

In a first method, a reaction mixture including silane reactants, for example TEOS and MTEOS, or, alternatively, TMOS and MTMOS; one or more dyes, such as dyes 1–10; a solvent or combination of solvents; and an acid/water mixture, is formed in a reaction vessel. Appropriate solvents include acetone, 2-propanol, and other simple alcohols, ketones and esters such as 1-propanol, MIBK, propoxypropanol, and propyl acetate. The acid/water mixture is., for example nitric acid and water. Other protic acids or acid anhydrides, such as acetic acid. formic acid, phosphoric acid, hydrochloric acid or acetic anhydride are alternatively used in the acid mixture. The resulting mixture is refluxed for between approximately 1 and 24 hours to produce the dyed SOG polymer solution. The dyed SOG can be diluted with appropriate solvents to achieve coating solutions that produce films of various thicknesses. Suitable dilutant solvents include acetone, 2-propanol, ethanol, butanol, propoxypropanol, methanol, and propylacetate. Optionally surfactants, such as the product FC430, provided by 3M (Minneapolis, Minn.), or the product Megaface R08, provided by DIC (Japan), are also added to the coating solution. The coating solution is typically between about 1 and 20% polymer by weight. Prior to use, the coating solution is filtered by standard filtration techniques.

According to a second method of forming dyed SOG materials, a reaction mixture including silane reactants, one or more of dyes 1–10, and a solvent or combination of solvents is formed in a reaction vessel. The reaction mixture is heated to reflux and refluxed for between approximately 1 and 24 hours. The silane reactants and solvents are as described in the first method above. An acid/water mixture, as described above, is added to the reaction mixture while stirring. The resulting mixture is heated to reflux and refluxed for between approximately 1 and 24 hours to produce the dyed SOG polymer. The dyed SOG is diluted and filtered as described above to form a coating solution.

The dyed SOG coating solutions are applied to various layers used in semiconductor processing, depending on the specific fabrication process, typically by conventional spin-on deposition techniques. These techniques include a dispense spin, a thickness spin, and thermal bake steps, to produce a dyed SOG anti-reflective coating. One typical process includes a thickness spin of 3000 rpm for 20 seconds and bake steps at 80° C. and 180° C. for one minute each. The dyed SOG anti-reflective coatings, according to the present invention exhibit refractive indices between about 1.3 and 1.5 and extinction coefficients greater than 0.07. In contrast, the extinction coefficient of dielectric materials such as silicon dioxide, silicate, and methylsiloxane, is equal to zero.

Figure 2A:
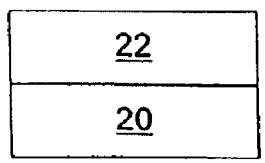
FIGS. 2a–2h illustrate the use of dyed spin-on-glass compositions, according to embodiments of the present invention as anti-reflective coating layers in a photolithography process.
Figure 2B:
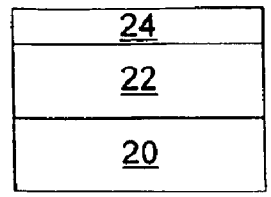
Figure 2C:
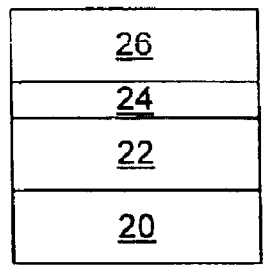
Figure 2D:
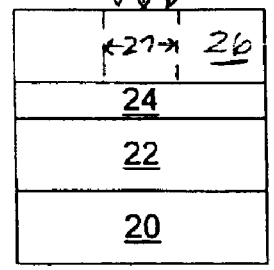

A general method of using a dyed spin-on-glass material according to the present invention as an anti-reflective coating in a photolithographic process is illustrated in FIGS. 2a–2h. As shown in FIG. 2a, a dielectric layer 22 is deposited on a silicon substrate 20. Dielectric layer 22 can be composed of a variety of dielectric materials including, for example, a silicon dioxide layer derived from TEOS, a silane based silicon dioxide layer, a thermally grown oxide, or a chemical-vapor-deposition-produced methylhydridosiloxane or silicon dioxide incorporating other elements or compounds. Dielectric layer 22 is typically an optically transparent medium. A dyed SOG anti-reflective coating layer 24 is applied above dielectric layer 22 (FIG. 2b) which is covered by a photoresist layer 26, of a conventional positive photoresist, to produce the stack shown in FIG. 2c. The stack of FIG. 2c is exposed to ultraviolet radiation 32 through mask 30, as shown in FIG. 2d. During the exposure, the dyed SOG ARC layer 24 absorbs UV light 32 transmitted through the photoresist. Because the dielectric layer 22 is transparent in the UV wavelength range, if dyed SOG ARC layer 24 were not present, the UV light 32 would reflect off the underlying silicon layer 20 degrading a critical dimension, for example critical dimension 27 of the exposed photoresist. In this example, a positive photoresist, which provides direct image transfer, is assumed.

Figure 2E:
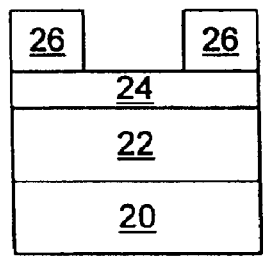

The exposed stack is developed to produce the stack of FIG. 2e. The dyed SOG ARC layer 24 is resistant to conventional photoresist developer solutions such as a 2.5% solution of tetramethylarnmoniumhydroxide (TMAH). In contrast, organic ARC layers, which have some of the chemical characteristics of the photoresist materials, are more sensitive to photoresist developers. Furthermore, it is anticipated that dyed SOG ARC layers are resistant to reducing chemistry, gas-based, photoresist stripping processes, whereas organic ARC's are not resistant. Thus, use of dyed SOG layers may facilitate photoresist rework, without the need to reapply the ARC layer.

Figure 2F:
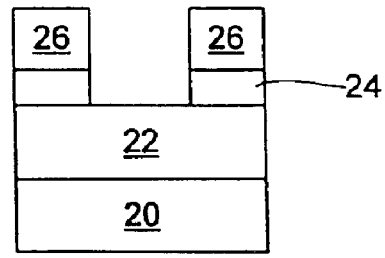

Next, a pattern is etched in the dyed SOG ARC layer 24 through the opening in photoresist layer 26 to produce the etched stack of FIG. 2f. A fluorocarbon etch, which has a high selectivity to photoresist, is used to etch the dyed SOG ARC layer 24. The response of the dyed SOG to a fluorocarbon etch provides an additional advantage of the dyed SOG over organic ARC layers, which require an oxygen plasma etch. An oxygen plasma etch can degrade the critical dimension of the developed photoresist because the photoresist, being organic based, is also etched by an oxygen plasma. A fluorocarbon plasma consumes less photoresist than an oxygen plasma. At shorter UV wavelengths, depth of focus requirements will limit the thickness of photoresist layer 26 at the exposure step shown in FIG. 2d. For example, it is estimated that at 193 nm, the thickness of photoresist layer should be approximately 300 nm. Thus, as these short wavelengths start to be employed, it will be important to have an ARC layer that can be etched selectively with respect to the photoresist.

Figure 2G:
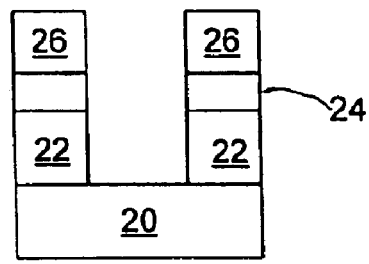
Figure 2H:
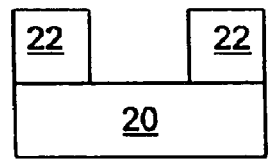

The fluorocarbon etch is continued through the dielectric layer 22 to produce the stack of FIG. 2g. Photoresist layer 26 is partially consumed during the continued etch process. Finally, the photoresist layer 26 is stripped using an oxygen plasma or a hydrogen reducing chemistry and the SOG ARC layer 24 is stripped using either a buffered oxide etch, for example a standard hydrofluoric acid/water mixture, or an aqueous or non-aqueous organoamine. Advantageously, the SOG ARC layer can be stripped with solutions that show a good selectivity with respect to the underlying dielectric layer. Thus, the general photolithographic method shown in FIGS. 2a–2h illustrate the process advantages of dyed SOG materials as anti-reflective coating layers.

The methods of synthesizing the dyed SOG materials as well as the synthesis of dye 10, 9-anthracene carboxymethyl triethoxysilane, are illustrated in the following examples.

EXAMPLE 1

Synthesis of Dyed SOG Containing 9-anthracene carboxy-methyl triethoxysilane

In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 72 grams deionized water were combined. The flask was refluxed for 4 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an nandk Company Model 200 analyzer. The film thickness was 1635 Å. At 248 nm, the refractive index (n) was 1.373 and the extinction coefficient (k) was 0.268. The same spin and bake process parameters and measurement technique was used in all of the following examples.

EXAMPLE 2

Synthesis of Dyed SOG Containing 9-anthracene methanol, 2-hydroxy-4(3-trieothoxysilypropoxy)-diphenylketone, and rosolic acid In a 1-liter flask 297 grams 2-propanol, 148 grams acetone, 123 grams TEOS, 77 grams MTEOS, 25 grams 9-anthracene methanol, 10 grams 2-hydroxy-4(3-trieothoxysilypropoxy)-diphenylketone, 5 grams rosolic acid, 0.6 grams 0.1 M nitric acid and 72 grams deionized water were combined. The flask was refluxed for 4 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added. Thickness=1436 Å, n=1.479, k=0.1255

EXAMPLE 3

Synthesis of Dyed SOG Containing 9-anthracene methanol, 2-hydroxy-4(3-trieothoxysilypropoxy)-diphenylketone, and rosolic acid In a 1-liter flask 297 grams 2-propanol, 148 grams acetone, 93 grams TEOS, 77 grams MTEOS, 20 grams 9-anthracene methanol, 60 grams 2-hydroxy-4(3-trieothoxysilypropoxy)-diphenylketone, 5 grams rosolic acid, 0.5599 grams 0.1 M nitric acid and 71.90 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M Minneapolis, Minn.) were added. Thickness=4248 Å. n=1.525, k=0.228

EXAMPLE 4

Synthesis of Dyed SOG Containing 9-anthracene methanol, 2-hydroxy-4(3-trieothoxysilypropoxy)-diphenylketone, and rosolic acid In a 1-liter flask 297 grams 2-propanol, 148 grams acetone, 108 grams TEOS, 77 grams MTEOS, 10 grams 9-anthracene methanol, 60 grams 2-hydroxy(3-trieothoxysilypropoxy)-diphenylke, 5 grams rosolic acid, 0.5599 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124

EXAMPLE 5

Synthesis of Dyed SOG Containing 2-hydroxy-4(3-trieothoxysilypropoxy)-diphenylketone In a 1-liter flask 297 grams 2-propanol, 148 grams acetone, 123 grams TEOS, 51 grams MTEOS, 60 grams 2-hydroxy-4-(3-trieothoxysilypropoxy)diphenylketone, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3592 Å, n=1.563, k=0.067

EXAMPLE 6

Synthesis of Dyed SOG Containing 9-anthracene methanol

In a 1-liter flask 297 grams 2-propanol, 148 grams acetone, 123 grams TEOS, 77 grams MTEOS, 10 grams 9-anthracene methanol, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3401 Å, n=1.433. k=0.106

EXAMPLE 7

Synthesis of Dyed SOG Containing 9-anthracene methanol, 2-hydroxy-4(3-trieothoxysilypropoxy)-diphenylketone, and rosolic acid In a 1-liter flask 297 grams 2-propanol, 148 grams acetone, 123 grams TEOS, 77 grams MTEOS, 20 grams 2-hydroxy-4(3-trieothoxysilypropoxy)diphenylketone, 25 grams of 9-anthracene methanol, and 5 grams of rosolic Acid, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3503 Å, n=1.475, k=0.193

EXAMPLE 8

Synthesis of Dyed SOG Containing 9-anthracene methanol, 2-hydroxy-4(3-trieothoxysilypropoxy)-diphenylketone, and rosolic acid In a 1-liter flask 297 grams 2-propanol, 148 grams acetone, 123 grams TEOS, 77 grams MTEOS, 5 grams 2-hydroxy-4(3-trieothoxysilypropoxy)diphenylketone, 25 grams of 9-anthracene methanol, and 5 grams of rosolic Acid, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3119 Å, n=1.454, k=0.175

EXAMPLE 9

Synthesis of Dyed SOG Containing 9-anthracene methanol, 2-hydroxy-4(3-trieothoxysilypropoxy)-diphenylketone, rosolic acid, quinizarin, and alizarin In a 1-liter flask 297 grams 2-propanol, 148 grams acetone, 123 grams TEOS, 77 grams MTEOS, 20 grams 2-hydroxy-4(3-trieothoxysilypropoxy)diphenylketone, 25 grams of 9-anthracene methanol, and 5 grams of rosolic acid, 2 grams of quinizarin, 2 grams alizarin, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added. The solution was filtered, then films are spun and characterized. The results were evaluated against the project design goals. Thickness=3554 Å, n=1.489, k=0.193

EXAMPLE 10

Synthesis of Dyed SOG Containing 9-anthracene methanol, 2-hydroxy-4(3-trieothoxysilypropoxy)-diphenylketone, rosolic acid, and alizarin In a 1-liter flask 297 grams 2-propanol, 148 grams acetone, 123 grams TEOS, 51.5 grams MTEOS, 5 grams 2-hydroxy-4(3-trieothoxysilypropoxy)diphenylketone, 25 grams of 9-anthracene methanol, 5 grams of rosolic acid, and 2 grams alizarin, 0.5599 grams 0.1 M nitric acid and 71.90 grams deionized water were combined. The flask was refluxed for 4 hours. To the solution, 56.68 grams of butanol, 87.99 grams 2-propanol, 44.10 grams of acetone, 59.31 grams of ethanol, 9.55 grams deionized water and 3.75 grams of 10% FC 430 (3M, Minneapolis, Minn.) were added. Thickness=3109 Å, n=1.454, k=0.193

EXAMPLE 11

Synthesis of dyed SOG containing 9-anthracene carboxy-methyl triethoxysilane

In a 1-liter flask 297 grams 2-propanol, 148 grams acetone, 123 grams TEOS, 77 grams MTEOS, 30 grams 9-anthracene carboxy-methyl triethoxysilane, 0.6 grams 0.1 M nitric acid and 72 grams deionized water were combined. The flask was refluxed for 4 hours. To the solution, 57 grams of butanol 88 grams 2-propanol, 44 grams of acetone, 59 grams of ethanol, 9.5 grams deionized water and 3.7 grams of 10% FC 430 (3M, Minneapolis, Minn.) were added. Thickness=3010 Å, n=1.377, k=0.163

EXAMPLE 12

Synthesis of Dyed SOG Containing 9-anthracene methanol

In a 1-liter flask 297 grams 2-propanol, 148 grams acetone, 123 grams TEOS, 77 grams MTEOS, and 10 grams 9-anthracene methanol are combined. The solution is refluxed for 6 hours. A mixture of 0.6 grams 0.1 M nitric acid and 72 grams deionized water are added to the flask. The flask is refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) are added.

EXAMPLE 13

Synthesis of dyed SOG containing 9-anthracene carboxy-methyl triethoxysilane

In a 1-liter flask 297 grams 2-propanol, 148 grams acetone, 90 grams TMOS, 59 grams MTMOS, 60 grams 9-anthracene carboxy-methyl triethoxysilane, 0.6 grams 0.1 M nitric acid and 72 grams deionized water are combined. The flask is refluxed for 4 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

EXAMPLE 14

Synthesis of 9-anthracene carboxy-methyl triethoxysilane

In a 2 L flask, 90.0 g 9-anthracenecarboxylic acid, 86.0 ml chloromethyltriethoxysilane, 66 ml triethylamine, and 1.25 L methylisobutylketone (MIBK) that had been dried over 4 Å molecular sieves were stirred, heated slowly to reflux and refluxed for 8.5 hours. The solution was transferred to a 2 L Teflon bottle and left overnight. A large quantity of solid precipitate formed. The MIBK solution was decanted and roto-evaporated to about 200 g. An equal weight of hexane was added and mixed. A precipitate formed. A 1.75 inch diameter by 2 inch high column of silica gel slurried with 20% ethylacetate/80% hexane was prepared. The MIBK/hexane solution was passed through the column under pressure and the column washed with 800 ml of 20% ethylacetate/80% hexane. The solution was filtered to 0.2 $\mu$m and roto-evaporated. When the solvent stopped coming off, the temperature was raised to 35° C. for 60 minutes. A dark amber oily liquid product was obtained (85 g).

Although the invention has been described with reference to particular examples, the description is only an example of the invention's application and should not be taken as a limitation. Various adaptations and combinations of features of the examples disclosed are within the scope of the invention as defined by the following claims.

We claim:

1. A layered material comprising a dyed spin-on glass anti-reflective composition, wherein the anti-reflective composition comprises a silicon-containing moiety and an incorporatable organic dye that strongly absorbs light over at least an approximately 10 nm wide wavelength range, the range at wavelengths less than about 260 nm, and wherein the organic dye comprises at least one amine group, at least one carboxylic acid group, at least one branched alcohol group, at least one ketone group, 9-anthracene carboxy-methyl triethoxysilane or mixtures thereof.

2. The layered material of claim 1, wherein the organic dye further comprises at least one benzene ring.

3. The layered material of claim 2, wherein the organic dye comprises anthraflavic acid, 9-anthracene carboxylic acid, 9-anthracene methanol, alizarin, quinzarin, primuline, 2-hydroxy-4(3-triethoxysilylpropoxy)-diphenylketone, rosolic acid, 9-anthracene carboxy-methyl triethoxysilane or mixtures thereof.

4. The layered material of claim 2, wherein the organic dye comprises a dye selected from the group consisting of 9-anthracene methanol, alizarin, quinzarin, primuline, 2hydroxy-4(3-triethoxysilylpropoxy)-diphenylketone, rosolic acid, 9-anthracene carboxy-methyl triethoxysilane, and mixtures thereof.

5. The layered material of claim 1, wherein the silicon-containing moiety comprises a siloxane polymer.

6. The layered material of claim 5, wherein the siloxane polymer is a polymer comprising methylsiloxane, methylsilsesquioxane, methyiphenylsiloxane, phenylsiloxane, methylphenylsilsesquioxane, and silicate polymers.

7. A layered material comprising a coating solution comprising the dyed spin-on glass composition of claim 1 and a solvent.

8. The layered material of claim 7, wherein the coating solution comprises between about 1% and 20% by weight dyed spin-on glass composition.

9. The layered material of claim 1, wherein at least part of the spin-on glass composition can be selectively removed.

10. The layered material of claim 2, wherein the at least one benzene ring comprises two or three fused benzene rings.

11. The layered material of claim 1, wherein the at least one amine group, at least one carboxylic acid group, at least one branched alcohol group, 9-anthracene carboxy-methyl triethoxysilane or at least one ketone group comprises a reactive group.

12. A semiconductor device comprising a dyed spin-on glass anti-reflective composition, wherein the anti-reflective composition comprises a silicon-containing moiety and an incorporatable organic dye that strongly absorbs light over at least an approximately 10 nm wide wavelength range, the range at wavelengths less than about 260 nm, and wherein the organic dye comprises at least one amine group, at least one carboxylic acid group, at least one branched alcohol group, at least one ketone group, 9-anthracene carboxy-methyl triethoxysilane or mixtures thereof.

13. The semiconductor device of claim 12, wherein the organic dye further comprises at least one benzene ring.

14. The semiconductor device of claim 13, wherein the organic dye comprises anthraflavic acid, 9-anthracene carboxylic acid, 9-anthracene methanol, alizarin, quinzarin, primuline, 2-hydroxy-4(3-triethoxysilylpropoxy)-dipbenylketone, rosolic acid, 9-anthracene carboxy-methyl triethoxysilane or mixtures thereof.

15. The semiconductor device of claim 13, wherein the organic dye comprises a dye selected from the group consisting of 9-anthracene methanol, alizarin, quinzarin, primuline, 2-hydroxy-4(3-triethoxysilylpropoxy)-diphenylketone, rosolic acid, 9-anthracene carboxy-methyl triethoxysilane, and mixtures thereof.

16. The semiconductor device of claim 12, wherein the silicon-containing moiety comprises a siloxane polymer.

17. The semiconductor device of claim 16, wherein the siloxane polymer is a polymer comprising methylsiloxane, methylsilsesquioxane, methyiphenylsiloxane, phenylsiloxane, methylphenylsilsesquioxane, and silicate polymers.

18. A semiconductor device comprising a coating solution comprising the dyed spin-on glass composition of claim 12 and a solvent.

19. The semiconductor device of claim 18, wherein the coating solution comprises between about 1% and 20% by weight dyed spin-on glass composition.

20. The semiconductor device of claim 12, wherein at least part of the spin-on glass composition can be selectively removed.

21. The semiconductor device of claim 13, wherein the at least one benzene ring comprises two or three fused benzene rings.

22. The semiconductor device of claim 12, wherein the at least one amine group, at least one carboxylic acid group, at least one branched alcohol group, 9-anthracene carboxymethyl triethoxysilane or at least one ketone group comprises a reactive group.

* * * * *